United States Patent
Sakurai et al.

(10) Patent No.: US 6,853,021 B2
(45) Date of Patent: Feb. 8, 2005

(54) ORIENTED FERROELECTRIC THIN-FILM DEVICE AND METHOD FOR MANUFACTURING THE SAME

(75) Inventors: Atsushi Sakurai, Kyoto (JP); Tadahiro Minamikawa, Ritto (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 10/236,952

(22) Filed: Sep. 9, 2002

(65) Prior Publication Data

US 2003/0062554 A1 Apr. 3, 2003

(30) Foreign Application Priority Data

Sep. 13, 2001 (JP) .......................................... 2001-278229

(51) Int. Cl.$^7$ ............................................. H01L 29/76
(52) U.S. Cl. ........................ 257/295; 257/310; 257/325
(58) Field of Search ................................ 257/310, 295, 257/325, 761, 767; 438/3, 240, 393

(56) References Cited

U.S. PATENT DOCUMENTS

| | | | | |
|---|---|---|---|---|
| 6,111,284 A | * | 8/2000 | Sakurai | ...................... 257/310 |
| 6,288,420 B1 | * | 9/2001 | Zhang et al. | ............... 257/295 |
| 6,396,092 B1 | * | 5/2002 | Takatani et al. | ............ 257/295 |

FOREIGN PATENT DOCUMENTS

| | | |
|---|---|---|
| JP | 2001-250424 | 9/2001 |
| JP | 2001-326141 | 11/2001 |

* cited by examiner

Primary Examiner—George Eckert
(74) Attorney, Agent, or Firm—Dickstein Shapiro Morin & Oshinsky LLP (57) ABSTRACT

An oriented ferroelectric thin-film device includes a substrate, a conductive thin-film disposed on the substrate, and a ferroelectric thin-film disposed on the conductive thin-film, wherein the conductive thin-film comprises a polycrystalline conductive material, the ferroelectric thin-film comprises a Pb-containing perovskite oxide and includes a first ferroelectric sub-layer and a second ferroelectric sub-layer, the first ferroelectric sub-layer is disposed on the conductive thin-film and has a composition changing in the thickness direction, and the second ferroelectric sub-layer is disposed on the first ferroelectric sub-layer and has a constant composition. The ferroelectric thin-film is oriented in a uniaxial direction such that the c-axis is perpendicular to the substrate. A method for manufacturing the oriented ferroelectric thin-film device includes the steps of forming a polycrystalline conductive thin-film on a substrate, and forming a ferroelectric thin-film on the polycrystalline conductive thin-film.

9 Claims, 6 Drawing Sheets

ORIENTED FERROELECTRIC THIN-FILM DEVICE AND METHOD FOR MANUFACTURING THE SAME

BACKGROUND OF THE INVENTION

1. Field of the Invention

The present invention relates to ferroelectric thin-film devices having a highly oriented ferroelectric thin-film disposed on a substrate, and particularly relates to an oriented ferroelectric thin-film device applicable to capacitors for DRAM and ferroelectric RAM, pyroelectric devices, microactuators, thin film capacitors, compact piezoelectric devices and other suitable devices. The present invention also relates to a method for manufacturing the oriented ferroelectric thin-film device.

2. Description of the Related Art

Studies have recently been conducted on oriented ferroelectric thin-film devices having a ferroelectric thin-film disposed on a single crystal substrate, wherein the ferroelectric thin-film comprises a Pb-containing perovskite compound such as PZT and PLZT having large residual polarization. In the oriented ferroelectric thin-film devices, spontaneous polarization can be arranged in one direction, thereby obtaining higher polarization values and switching characteristics. Therefore, it is expected that the application of the oriented ferroelectric thin-film devices to a high-density recording medium be significantly increased.

Thus, research and development has been actively conducted on a method for forming an oriented thin-film comprising a Pb-containing perovskite compound such as $PbTiO_3$, (Pb, La)$TiO_3$ (PLT), PZT, PLZT, and Pb(Mg, Nb)$O_3$ (PMN) on a single crystal substrate. Such a method is currently being used.

However, it is not necessarily easy to obtain the above oriented ferroelectric thin-film device in which a ferroelectric oxide thin-film having excellent crystallinity and uniaxial orientation is disposed on a single crystal substrate. The reasons are described below.

(1) Since a Pb-containing perovskite ferroelectric is formed only at a temperature higher than its phase transition temperature, a 90° domain is formed so as to relieve the stress caused by the phase transition during a cooling step after forming the thin-film. Applying compression stress to thin-films is generally effective in order to suppress the formation of the 90° domain. Thus, a substrate having a large temperature coefficient of expansion is usually employed to apply compression stress to thin-films by using the thermal contractive force of the substrate during a cooling step after forming the thin-films. However, when the single crystal substrate comprises Si or $Al_2O_3$ having a small thermal contractive force, this method is not effective because compression stress cannot sufficiently be applied to the thin-film and it is thus difficult to prevent the formation of the 90° domain.

(2) A method for forming an oriented PZT layer on an Si substrate having Pt—Ti electrodes disposed thereon is proposed in Jpn. J. Appl. Phys. Vol. 37 (1998), L5128. The method in which a template layer comprising $PbTiO_3$ is formed on a Pt—Ti—Si substrate by a laser ablation process, that is, a pulsed laser deposition process, to grow an oriented PZT layer by a sol-gel method. However, according to this method, there is a problem in that cost of providing vacuum equipment such as a deposition chamber is high and production cost is also high due to an increase in the number of production steps because ultra high vacuum is required to form the $PbTiO_3$ layer. Furthermore, the production cost is increased due to the use of expensive single crystal substrates.

SUMMARY OF THE INVENTION

In order to overcome the problems described above, preferred embodiments of the present invention provide an oriented ferroelectric thin-film device including a substrate and a highly oriented ferroelectric thin-film disposed above the substrate and to provide a method for manufacturing a oriented ferroelectric thin-film device, wherein the device has high performance and can be manufactured at low cost and the method can provide the device effectively.

According to a preferred embodiment of the present invention, an oriented ferroelectric thin-film device includes a substrate, a conductive thin-film disposed on the substrate, and a ferroelectric thin-film disposed on the conductive thin-film, wherein the conductive thin-film is disposed by growing polycrystalline of conductive material. The ferroelectric thin-film preferably further comprises a Pb-containing perovskite oxide expressed by the formula $ABO_3$ in which the A comprises Pb or a mixture of Pb and at least La and the B comprises at least one element selected from the group consisting of Ti, Zr, Mg, and Nb. Preferably, the ferroelectric thin-film includes a first ferroelectric sub-layer and a second ferroelectric sub-layer; the first ferroelectric sub-layer is disposed on the conductive thin-film and has a composition changing in the thickness direction; the second ferroelectric sub-layer is disposed on the first ferroelectric sub-layer and has constant composition. The first and second ferroelectric sub-layers have substantially the same composition at the boundary therebetween; and the ferroelectric thin-film is oriented in a uniaxial direction such that the c axis is perpendicular to the substrate.

Since the oriented ferroelectric thin-film device has the above configuration, the spontaneous polarization can be oriented in a single direction, and the large intensity of polarization and the excellent switching characteristics can be achieved. Therefore, the oriented ferroelectric thin-film device can be used for high-density recording media.

Other ferroelectric thin-film devices having the following structure can be prepared by the epitaxial growth of a ferroelectric thin-film wherein a conductive thin-film is disposed on a substrate and the ferroelectric thin-film comprising a Pb-containing perovskite oxide is disposed on the conductive thin-film. Such ferroelectric thin-film devices also have high performance. However, when the ferroelectric thin-film is formed by an epitaxial growth method, a layer under the ferroelectric thin-film must be a monocrystalline material. Therefore, a substrate for forming the conductive thin-film thereon must be a monocrystalline oxide, which is expensive, or a layered substrate such as an Si substrate having a complicated structure. Thus, there is a problem in that the production process is complicated and the production cost is increased.

In contrast, according to the present invention, the ferroelectric thin-film is disposed on the polycrystalline conductive thin-film and comprises a perovskite oxide which is oriented in a uniaxial direction such that the c-axis is perpendicular to the substrate. Thus, it is not necessary to use an expensive monocrystalline oxide or a substrate having a complicated layered structure, thereby obtaining the oriented ferroelectric thin-film device having excellent characteristics at low cost.

Generally, perovskite oxide thin-films that are oriented in a uniaxial direction such that the c-axis is perpendicular to a substrate have a small dielectric constant, a large residual polarization intensity, a large pyroelectric coefficient, and high insulating properties, in common with other perovskite oxide thin-films formed by an epitaxial growth method. Accordingly, the oriented ferroelectric thin-film device of the present invention has substantially the same performances as those of other oriented ferroelectric thin-film devices with an epitaxially grown ferroelectric thin-film.

In the above oriented ferroelectric thin-film device, the Pb-containing perovskite oxide preferably includes a ferroelectric material expressed by the formula $(Pb_xM_{1-x})(Zr_yTi_{1-y})O_3$.

Since the Pb-containing perovskite oxide of the ferroelectric thin-film comprises such a ferroelectric material, that is, lead zirconate titanate, the oriented ferroelectric thin-film device has higher performance.

In the above oriented ferroelectric thin-film device, the first ferroelectric sub-layer has composition in which the value of y in the formula $(Pb_xM_{1-x})(Zr_yTi_{1-y})O_3$ increases from the interface between the polycrystalline conductive thin-film and the first ferroelectric sub-layer in the thickness direction and the value of y is 0.05 to 0.6.

Since the first ferroelectric sub-layer has such a structure, desired characteristics are surely achieved, thereby enhancing the effect of the present invention.

When the value of y is less than 0.05, the crystal growth proceeds out of the desired manner because changes in the lattice constants of the Pb-containing perovskite oxide are too large. When the value of y is more than 0.6, the crystallinity is decreased due to the occurrence of phase transition.

In the above oriented ferroelectric thin-film device, the value of y changes from 0.001 to 0.1 per 1 nm of thickness in the first ferroelectric sub-layer.

Since the value of y changes at such a rate, desired characteristics are surely achieved. When the value of y changes by less than 0.001 per 1 nm of thickness, the change is too small for practical use. When the value of y changes by more than 0.1 per 1 nm of thickness, the change is too large to maintain good crystallinity.

In the above oriented ferroelectric thin-film device, the first ferroelectric sub-layer has a thickness of 5 to 100 nm.

When the first ferroelectric sub-layer has such a thickness, desired characteristics are surely achieved. When the thickness is less than 5 nm, the first ferroelectric sub-layer cannot provide stress to the second ferroelectric sub-layer so that the formation of a 90° domain cannot be prevented. When the thickness is more than 100 nm, the thickness is too large for practical use.

In the above oriented ferroelectric thin-film device, the substrate comprises a single crystal of Si, $Al_2O_3$, or diamond.

When the substrate comprises such a material, it is possible to form the polycrystalline conductive thin-film having good crystallinity on the substrate. However, using such a material is not essential in the present invention.

In the above oriented ferroelectric thin-film device, the polycrystalline conductive thin-film is a metal layer containing 50% or more of at least one element selected from the group consisting of Au, Pt, Rh, Ir, and Pd.

When the polycrystalline conductive thin-film contains such an element as a main component, the ferroelectric thin-film on the conductive thin-film is readily crystallized because the conductive thin-film has substantially the same lattice constant as that of the ferroelectric thin-film comprising the Pb-containing perovskite oxide. Furthermore, the polycrystalline conductive thin-film is stable under the high temperature condition of forming the Pb-containing perovskite oxide.

In order to achieve the above object, a method for manufacturing an oriented ferroelectric thin-film device includes the steps of forming a polycrystalline conductive thin-film on a substrate, and forming a ferroelectric thin-film on the polycrystalline conductive thin-film so that the ferroelectric thin-film is oriented in a uniaxial direction such that the c axis is perpendicular to the substrate, the ferroelectric thin-film comprising a Pb-containing perovskite oxide expressed by the formula $ABO_3$ in which the A comprises Pb or a mixture Pb and at least La and the B comprises at least one element selected from the group consisting of Ti, Zr, Mg, and Nb, wherein the step of forming the ferroelectric thin-film comprises the sub-steps of forming a first ferroelectric sub-layer on the polycrystalline conductive thin-film by supplying ferroelectric thin-film raw materials while changing the ratio thereof so that the first ferroelectric sub-layer has a composition changing in the thickness direction, and forming a second ferroelectric sub-layer on the first ferroelectric sub-layer by supplying the ferroelectric thin-film raw materials at a constant ratio so that the second ferroelectric sub-layer has a constant composition.

In the above method according to the present invention, an oriented ferroelectric thin-film device having the following characteristics is provided: spontaneous polarization oriented in a single direction, large intensity of polarization, and excellent switching characteristics. Therefore, the oriented ferroelectric thin-film device can be used for high-density recording media.

In the above method, the first ferroelectric sub-layer comprising the Pb-containing perovskite oxide expressed by the formula $(Pb_xM_{1-x})(Zr_yTi_{1-y})O_3$ is formed by supplying the ferroelectric thin-film raw materials while changing the ratio thereof so that the value of y in the formula increases from 0.05 to 0.6 from the interface between the polycrystalline conductive thin-film and the ferroelectric thin-film in the thickness direction.

According to the above method, an oriented ferroelectric thin-film device having the following characteristics can be surely provided: the spontaneous polarization oriented in a single direction, the large intensity of polarization, and excellent switching characteristics. Therefore, the oriented ferroelectric thin-film device can be used for high-density recording media.

In the above method, the first ferroelectric sub-layer is grown at a rate of 5 to 100 nm/minute.

When the rate is 5 nm/minute or less, the rate is too slow for practical use. When the rate is 100 nm/minute or more, the rate is too fast to form a ferroelectric thin-film having good crystallinity.

Other feature, elements, characteristics and advantages of the present invention will become more apparent from the following detailed description of preferred embodiments of the present invention with reference to the attached drawings.

DETAILED DESCRIPTION OF PREFERRED EMBODIMENTS

The features of the present invention will now be described in detail with an example.

Figure 1:
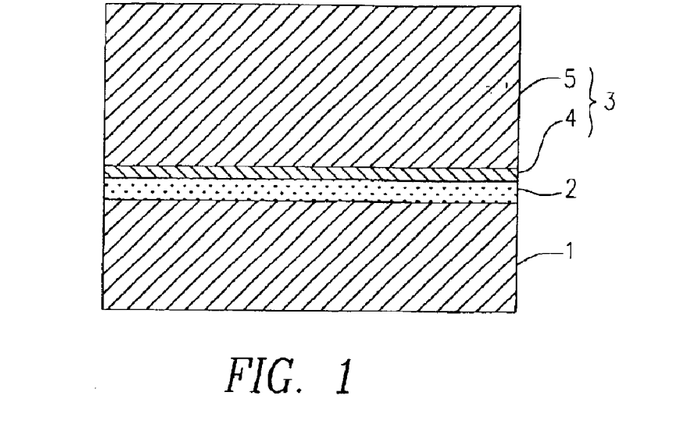
FIG. 1 is a sectional view showing an oriented ferroelectric thin-film device according to the present invention.

FIG. 1 is a sectional view showing an exemplary oriented ferroelectric thin-film device according to the present invention.

The oriented ferroelectric thin-film device has a substrate 1 having a diameter of 3 inches, a conductive thin-film 2 disposed on the substrate 1, and a ferroelectric thin-film 3 disposed on the polycrystalline conductive thin-film 2. The substrate 1 comprises an Si (100) crystal having a polycrystalline oxide film ($SiO_2$) thereon, the conductive thin-film 2 comprises polycrystalline Pt—Ti, and the ferroelectric thin-film 3 comprises a Pb-containing perovskite oxide. The ferroelectric thin-film 3 has a first ferroelectric sub-layer 4 and a second ferroelectric sub-layer 5, wherein the first ferroelectric sub-layer 4 has a composition changing in the thickness direction and the second ferroelectric sub-layer 5 has a constant composition.

In this example, the first ferroelectric sub-layer 4 has its composition expressed by the formula $Pb(Zr_{0.20}Ti_{0.80})O_3$ at the interface between the polycrystalline conductive thin-film 2 and has its composition expressed by the formula $Pb(Zr_{0.52}Ti_{0.48})O_3$ at the boundary between the second ferroelectric sub-layer 5. The second ferroelectric sub-layer 5 has a constant composition expressed by the formula $Pb(Zr_{0.52}Ti_{0.48})O_3$. The first ferroelectric sub-layer 4 and the second ferroelectric sub-layer 5 accordingly have the same composition at the boundary therebetween.

In this oriented ferroelectric thin-film device, the ferroelectric thin-film 3 is oriented in a uniaxial direction such that the c axis is perpendicular to the substrate 1.

This oriented ferroelectric thin-film device was prepared according to the following procedure.

(1) An Si (100) wafer having a diameter of 3 inches was provided for the substrate 1 and was ultrasonically washed in a solvent such as acetone or ethanol.

In the present invention, the substrate is not limited to the Si (100) wafer and Si (111) and Si (110) wafers may be used.

Furthermore, a glass substrate and a single crystal such as diamond may be used.

(2) A polycrystalline oxide ($SiO_2$) was formed on the substrate 1. A polycrystalline Ti thin-film having a thickness of 50 nm and a polycrystalline Pt thin-film having a thickness of 300 nm were continuously formed on the resulting substrate 1 in that order using a DC magnetron sputtering system under the following conditions: a total pressure of 0.2 Pa, an oxygen partial pressure of 0.02 Pa, and a substrate temperature of 400° C. The Ti and Pt thin-films together formed the polycrystalline conductive thin-film 2 having a double layer structure.

The Ti and Pt thin-films may also be formed by an electron beam vapor deposition process, an RF sputtering process, an ion beam sputtering process, an ECR sputtering process, and an MOCVD process and other suitable processes.

Figure 2:
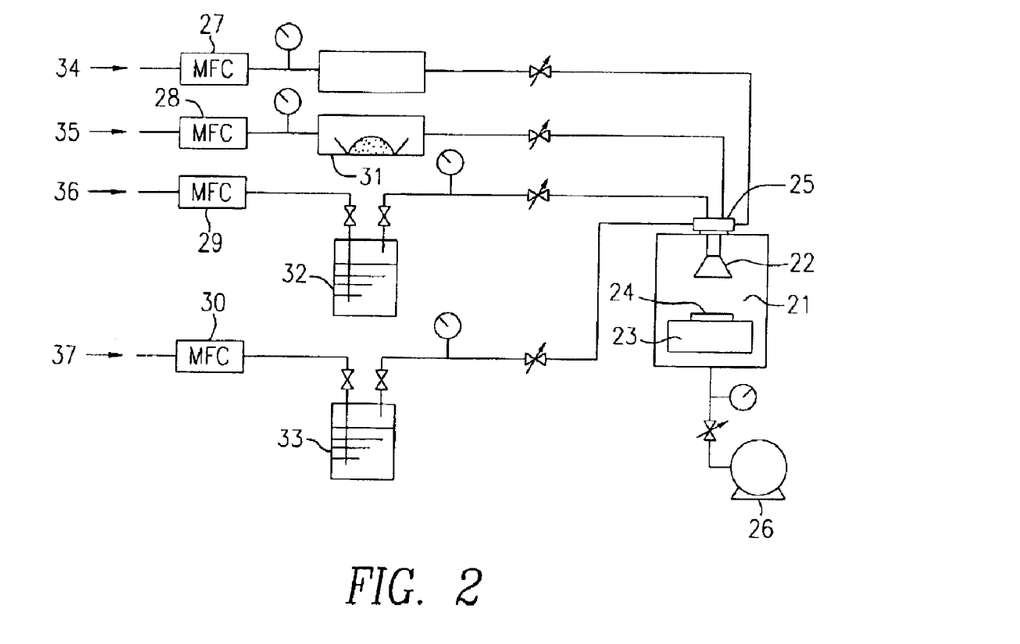
FIG. 2 is a schematic view showing a MOCVD system used in an example of the present invention and a comparative example.

(3) The ferroelectric thin-film 3 was formed on the polycrystalline conductive thin-film 2 using an MOCVD system shown in FIG. 2.

As shown in FIG. 2, the MOCVD system used in this example is equipped with a vacuum container 21 and a vacuum pump 26, and vacuum can be applied to the vacuum container 21 with the vacuum pump 26. The vacuum container 21 has a gas mixer 25, a gas outlet nozzle 22 for introducing a gas from the gas mixer 25 to the vacuum container 21, and a substrate heater 23 for heating a substrate 24. Furthermore, the MOCVD system is equipped with a solid vaporizer 31 for vaporizing solid $Pb(DPM)_2$, which is the precursor of Pb, a liquid vaporizer 32 for vaporizing liquid $Zr(O-T-C_4H_9)_4$, which is the precursor of Zr, and another liquid vaporizer 33 for vaporizing liquid $Ti(O-T-C_3H_7)_4$, which is the precursor of Ti. A Pb compound vapor, a Zr compound vapor, and a Ti compound vapor, which are thin-film raw materials, are generated from the above corresponding compounds with the solid vaporizer 31 and the liquid vaporizers 32 and 33, respectively. The Pb, Zr, and Ti compound vapors are supplied to the vacuum container 21 along with carrier gases 35, 36, and 37, respectively, Ar supplied through mass flow controllers 28, 29, and 30, respectively. An $O_2$ gas 34 is also supplied to the vacuum container 21 through a mass flow controller 27.

In this example, the oriented ferroelectric thin-film device shown in FIG. 1 is prepared using the MOCVD system having the above configuration. In the method for preparing the oriented ferroelectric thin-film device, the carrier gases for the Pb and Zr compound vapors are changed in a step-by-step manner to form the first ferroelectric sub-layer 4 which has a thickness of about 50 nm and the composition gradually changes in the thickness direction, that is, the Zr content increases from the interface between the polycrystalline conductive thin-film 2 and the first ferroelectric sub-layer 4 in the thickness direction. The second ferroelectric sub-layer 5 with a thickness of about 450 nm is formed on the first ferroelectric sub-layer 4 and has a constant composition.

Particularly, the ferroelectric thin-film 3 with a thickness of about 500 nm comprising lead zirconate titanate (PZT) is formed on the polycrystalline conductive thin-film 2 at a total pressure of 1,000 Pa, in which the partial pressure of oxygen is 500 Pa, at a substrate temperature of 700° C., wherein the ferroelectric thin-film 3 has the first ferroelectric sub-layer 4 with a thickness of about 50 nm and the second ferroelectric sub-layer 5 with a thickness of about 450 nm.

In this example, the first ferroelectric sub-layer 4 composition has a changing composition expressed by the formula Pb(Zr$_{0.20}$Ti$_{0.80}$)O$_3$ to Pb(Zr$_{0.52}$Ti$_{0.48}$)O$_3$ in the thickness direction and the second ferroelectric sub-layer 5 has constant composition expressed by the formula Pb(Zr$_{0.52}$Ti$_{0.48}$)O$_3$.

Detailed conditions for forming the ferroelectric thin-film 3, which is a PZT thin-film, is shown in Table 1.

TABLE 1

| Item | Vaporization Temperature (° C.) | Carrier Gas Flow rate (sccm) | Vaporizer Pressure (Pa) |
|---|---|---|---|
| Pb Compound | 130 | 100 (Ar) | 500 |
| Zr compound | 35 | 50 (Ar) | 500 |
| Ti Compound | 50 | 50 (Ar) | 500 |
| Oxygen Gas | — | 500 | — |

Figure 3:
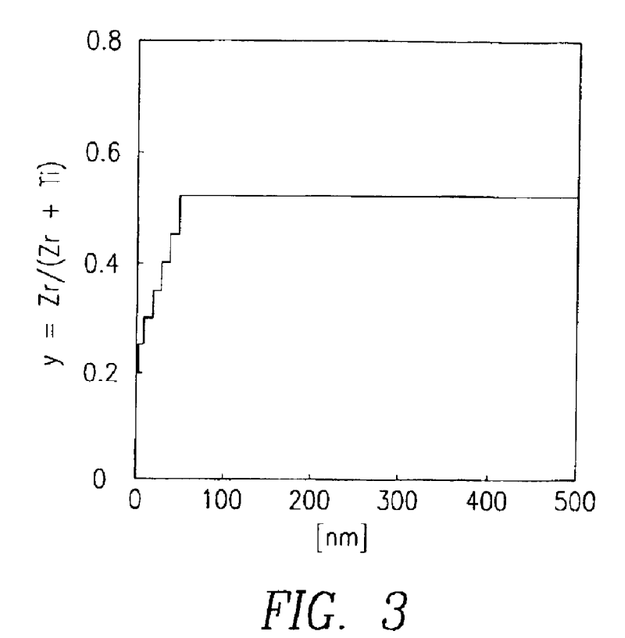
FIG. 3 is an illustration showing changes in the composition of a ferroelectric thin-film in a ferroelectric thin-film device prepared in an example of the present invention.

FIG. 3 shows changes of the formation, which is represented by y, (that means changes in the ratio of Zr), in the ferroelectric thin-film 3 prepared by the above method. The ferroelectric thin-film 3 has composition expressed by the formula Pb(Zr$_y$Ti$_{1-y}$)O$_3$ and includes the first ferroelectric sub-layer 4 in which the Zr content increases from the interface between the polycrystalline conductive thin-film 2 and the second ferroelectric sub-layer 5 having a constant composition. As shown in FIG. 3, the ratio y increases in a portion corresponding to the first ferroelectric sub-layer 4, and the ratio y is constant in another portion corresponding to the second ferroelectric sub-layer 5. The first ferroelectric sub-layer 4 and the second ferroelectric sub-layer 5 have the same ratio y at the boundary therebetween.

COMPARATIVE EXAMPLE

Figure 4:
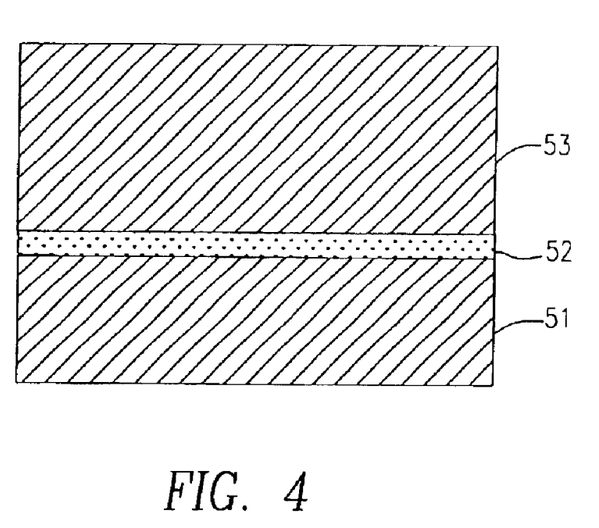
FIG. 4 is a sectional view showing a ferroelectric thin-film device prepared in a comparative example.

FIG. 4 is an illustration of a ferroelectric thin-film device according to a comparative example. The ferroelectric thin-film device of this comparative example includes a substrate 51, a conductive thin-film 52 disposed on the substrate 51, and a ferroelectric thin-film 53 disposed on the conductive thin-film 52, wherein the substrate 51 comprises a Si (100) single crystal, the conductive thin-film 52 comprises polycrystalline Pt—Ti, and the ferroelectric thin-film 53 comprises a Pb-containing perovskite oxide expressed by the formula Pb(Zr$_{0.52}$Ti$_{0.48}$)O$_3$ and has a constant composition.

This ferroelectric thin-film device was prepared according to the following procedure.

(1) In the same way as in the above example, a Ti thin-film with a thickness of 50 nm and a Pt thin-film with a thickness of 100 nm were continuously formed on the substrate 51 comprising the Si (100) single crystal in that order by a DC magnetron sputtering process under the following conditions: a total pressure of 0.2 Pa, an oxygen partial pressure of 0.02 Pa, and a substrate temperature of 400° C. The Ti thin-film and the Pt thin-film disposed thereon together form the polycrystalline conductive thin-film 52.

(2) The ferroelectric thin-film 53 with a thickness of 1 μm (1,000 nm) was formed on the Pt thin-film by an MOCVD process under the following conditions: a total pressure of 1,000 Pa, an oxygen partial pressure of 500 Pa, and a substrate temperature of 600° C. The ferroelectric thin-film 53 had constant composition. As shown in FIG. 4, the ferroelectric thin-film device of the comparative example was thus completed.

COMPARISON BETWEEN EXAMPLE OF THE PRESENT INVENTION AND COMPARATIVE EXAMPLE

Figure 5:
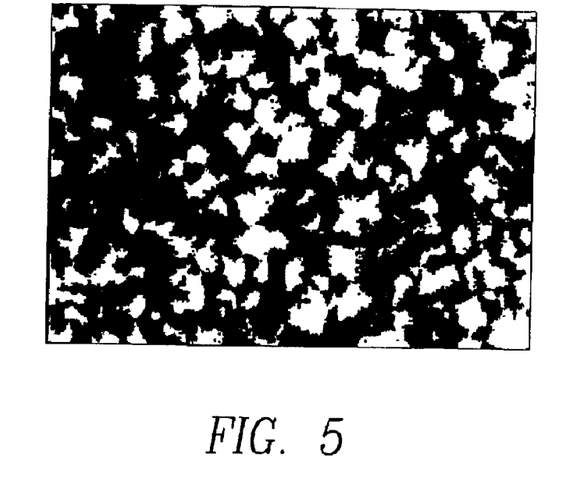
FIG. 5 is an illustration showing an SEM image of the surface of a ferroelectric thin-film in an oriented ferroelectric thin-film device of an example according to the present invention.
Figure 6:
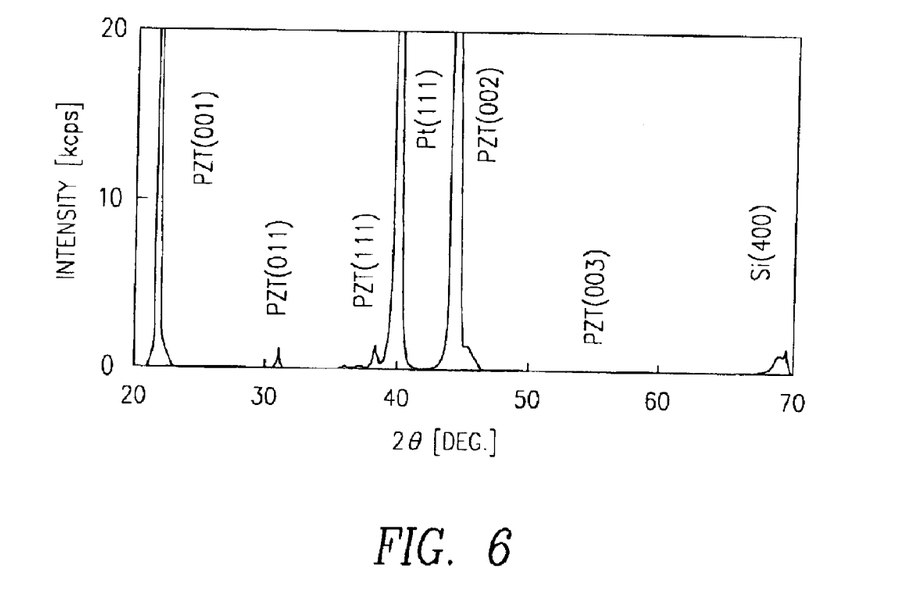
FIG. 6 is an illustration showing an XRD pattern of a PZT-Pt—Ti thin-film formed on an Si substrate in an example according to the present invention.
Figure 7:
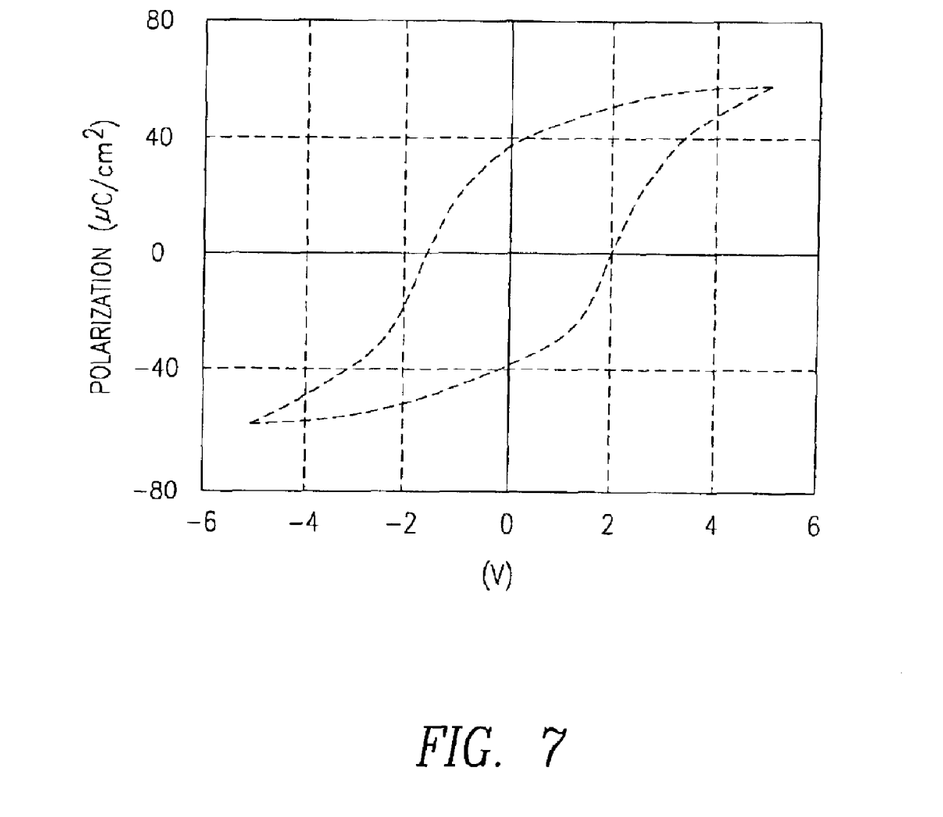
FIG. 7 is an illustration showing a P-E hysteresis loop of a ferroelectric thin-film in an oriented ferroelectric thin-film device of an example according to the present invention.

FIG. 5 is an SEM image showing the surface of the ferroelectric thin-film in the oriented ferroelectric thin-film device prepared in the example of the present invention. FIG. 6 is an illustration showing an XRD pattern of a PZT-Pt—Ti thin-film formed on the Si substrate of the example of the present invention. FIG. 7 is an illustration showing a P-E hysteresis loop of the ferroelectric thin-film in the oriented ferroelectric thin-film device of the example of the present invention.

The electrical characteristics of the ferroelectric thin-film having a thickness of 1,000 nm in the oriented ferroelectric thin-film device of the example are shown in Table 2. Table 2 shows values obtained in the measurement of the tan δ and the relative dielectric constant at a frequency of 1 kHz and a voltage of 0.1 V.

TABLE 2

| Samples | tan δ (%) | Relative Dielectric Constant | Thickness (nm) |
|---|---|---|---|
| PZT Thin-Film of Example | 3.1 | 670 | 1,000 |
| PZT Thin-Film of Comparative Example | 6.3 | 250 | 1,000 |

Figure 8:
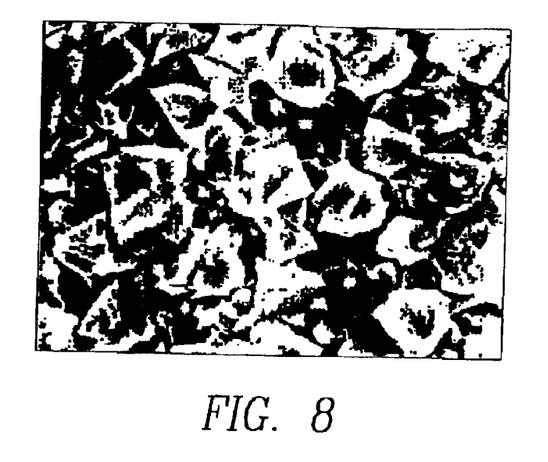
FIG. 8 is an illustration showing an SEM image of the surface of a ferroelectric thin-film in an ferroelectric thin-film device of a comparative example.
Figure 9:
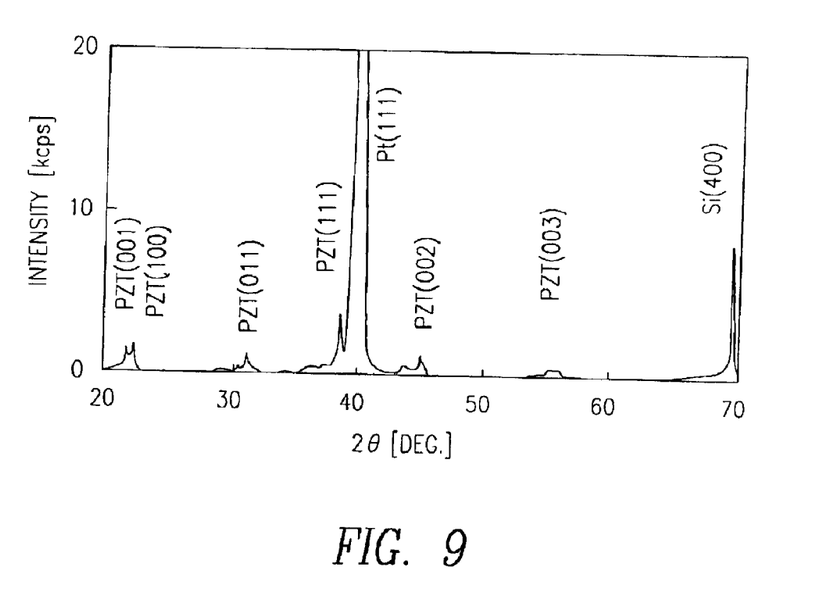
FIG. 9 is an illustration showing an XRD pattern of a PZT-Pt—Ti thin-film formed on an Si substrate in a comparative example.
Figure 10:
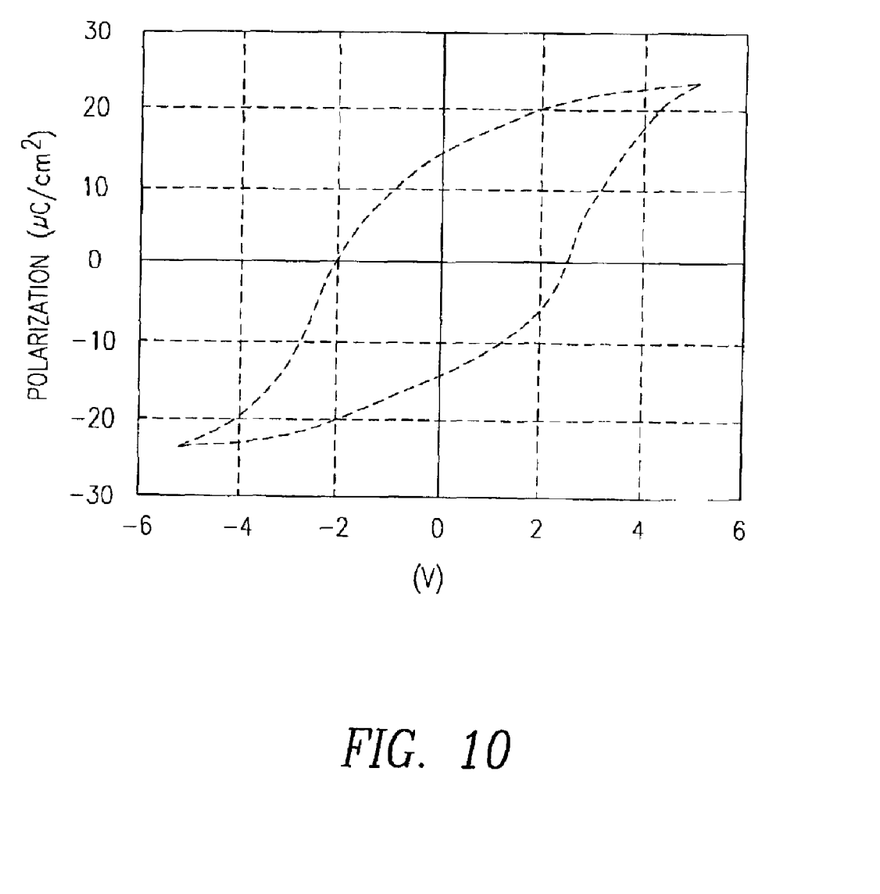
FIG. 10 is an illustration showing a P-E hysteresis loop of a ferroelectric thin-film in an oriented ferroelectric thin-film device of a comparative example.

FIG. 8 is an SEM image showing the surface of the ferroelectric thin-film in the ferroelectric thin-film device prepared in the comparative example. FIG. 9 is an illustration showing an XRD pattern of the PZT and Pt—Ti thin-films formed on the Si substrate in the comparative example. FIG. 10 is an illustration showing a P-E hysteresis loop of the ferroelectric thin-film in the ferroelectric thin-film device of the comparative example.

The electrical characteristics of the ferroelectric thin-film having a thickness of 1,000 nm in the ferroelectric thin-film device of the comparative example are also shown in Table 2.

As shown in FIG. 8, the ferroelectric thin-film of the comparative example has an irregular surface. In contrast, as shown in FIG. 5, the ferroelectric thin-film of the example has a surface smoother than that of the comparative example.

FIG. 9 shows an XRD pattern of the ferroelectric thin-film device of the comparative example having the PZT thin-film, which is the ferroelectric thin-film, on the Pt—Ti thin-film on the prepared substrate. It is clear from FIG. 9 that the PZT thin-film has a perovskite structure and is not oriented in a specific axis direction because a PZT (001) peak and a PZT (100) peak are observed, which means that a 90° domain is formed in the PZT thin-film. Furthermore, since the intensities of the peaks are weak, the PZT thin-film is not perfectly crystallized. The half-width value of a PZT(001) locking curve is 2.1°.

In contrast, FIG. 6 shows an XRD pattern of the ferroelectric thin-film device in the example of the present invention having the PZT thin-film, which is the ferroelectric thin-film, on the Pt—Ti thin-film on the substrate. It is clear from FIG. 6 that the PZT thin-film has a perovskite structure and a (001) orientation because only a PZT (001) peak is observed. Since a PZT (100) peak is not observed, a 90° domain is not formed in the PZT thin-film. The half-width value of a PZT(001) locking curve is 0.4°.

FIG. 10 shows a P-E hysteresis loop of the ferroelectric thin-film prepared in the comparative example. It is clear from FIG. 10 that the ferroelectric thin-film has a residual polarization of 15 μC/cm$^2$, which is small. This means that the ferroelectric thin-film has an inferior orientation.

FIG. 7 shows a P-E hysteresis loop of the ferroelectric thin-film prepared in the example of the present invention.

It is clear from FIG. 10 that the ferroelectric thin-film has a residual polarization of 40 $\mu C/cm^2$, which is large. This means that the ferroelectric thin-film has an excellent orientation.

In Table 2, the ferroelectric thin-film in the ferroelectric thin-film device prepared in the comparative example has a tan δ of 6.3% and a relative dielectric constant of 250, and in contrast the ferroelectric thin-film in the oriented ferroelectric thin-film device prepared in the example of the present invention has a tan δ of 3.1% and a relative dielectric constant of 670. This means that the ferroelectric thin-film of the example of the present invention has excellent characteristics.

In the above example, the composition of the thin-film raw material vapor mixture supplied to the vacuum container 21 is changed in a step-by-step manner to change, that is, increase the Zr content in a step-by-step manner. The composition may be changed continuously.

A method for forming the ferroelectric thin-film is not limited to an MOCVD process, and the following processes may be used: a plasma CVD process, a laser CVD process, a laser ablation process, a sputtering process, a vapor deposition process, and an MBE process.

In the above example, the flow rates of the carrier gases are controlled to change the ratio of the thin-film raw material vapors supplied to the vacuum container 21. The ratio of the thin-film raw material vapors may be changed by controlling the vaporization temperature or the vaporization pressure of the raw materials.

The ratio of the thin-film raw material vapors may also be changed by controlling the flow rates of the carrier gases for the Zr compound and the Ti compound or by controlling the flow rates of the carrier gases for the Pb compound and the Ti compound.

In the above example, the three raw materials independently containing the Pb, Zr, and Ti compounds are supplied from the separate vaporizers. A mixture of the Pb and Zr compounds or another mixture of the Pb and Ti compounds may be used as a raw material. Solutions of the above compounds in proper solvents may be supplied.

The present invention is not limited to the embodiments and the examples described above, and within the scope of the present invention, various modifications and various changes may be performed for the thickness or the deposition conditions of the ferroelectric thin-film.

What is claimed is:

1. An oriented ferroelectric thin-film device comprising:
   a substrate;
   a polycrystalline conductive thin-film disposed on the substrate; and
   a ferroelectric thin-film disposed on the polycrystalline conductive thin-film, the ferroelectric thin-film comprising a Pb-containing perovskite oxide expressed by the formula $ABO_3$, wherein A is one of Pb and a mixture of Pb and La, and B is at least one element selected from the group consisting of Ti, Zr, Mg and Nb, and the ferroelectric thin-film including:
   a first ferroelectric sub-layer disposed on a surface of the polycrystalline conductive thin-film; and
   a second ferroelectric sub-layer disposed on a surface of the first ferroelectric sub-layer, wherein
   the first ferroelectric sub-layer has a composition which changes from the surface of the polycrystalline conductive thin-film towards the second ferroelectric sub-layer, the second ferroelectric sub-layer has a constant composition, and the first and second ferroelectric sub-layers have substantially the same composition at the boundary therebetween.

2. The oriented ferroelectric thin-film device according to claim 1, wherein the ferroelectric thin-film is oriented in a uniaxial direction such that a c-axis of the ferroelectric thin-film is perpendicular to the substrate.

3. The oriented ferroelectric thin-film device according to claim 1, wherein the Pb-containing perovskite oxide comprises a ferroelectric material expressed by the formula $(Pb_xM_{1-x})(Zr_yTi_{1-y})O_3$.

4. The oriented ferroelectric thin-film device according to claim 3, wherein the first ferroelectric sub-layer has a composition in which the value of y in the formula $(Pb_xM_{1-x})(Zr_yTi_{1-y})O_3$ increases from the surface of the polycrystalline conductive thin-film towards the second ferroelectric sub-layer.

5. The oriented ferroelectric thin-film device according to claim 4, wherein the value of y is in the range of 0.05 to 0.6.

6. The oriented ferroelectric thin-film device according to claim 4, wherein the value of y increases in the range of 0.001 to 0.1 per 1 nm of thickness of the first ferroelectric sub-layer.

7. The oriented ferroelectric thin-film device according to claim 1, wherein the first ferroelectric sub-layer has a thickness of 5 to 100 nm.

8. The oriented ferroelectric thin-film device according to claim 1, wherein the substrate comprises a single crystal of one of Si, $Al_2O_3$ and diamond.

9. The oriented ferroelectric thin-film device according to claim 1, wherein the polycrystalline conductive thin-film is a metal layer containing 50% or more of at least one element selected from the group consisting of Au, Pt, Rh, Ir and Pd.

* * * * *